(12) United States Patent
Motonaga et al.

(10) Patent No.: US 6,933,082 B2
(45) Date of Patent: Aug. 23, 2005

(54) PHOTOMASK WITH DUST-PROOFING DEVICE AND EXPOSURE METHOD USING THE SAME

(75) Inventors: Toshiaki Motonaga, Tokyo (JP); Hiro-o Nakagawa, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 56 days.

(21) Appl. No.: 10/288,936

(22) Filed: Nov. 6, 2002

(65) Prior Publication Data

US 2003/0087165 A1 May 8, 2003

(30) Foreign Application Priority Data

Nov. 8, 2001 (JP) ........................................ 2001-343673

(51) Int. Cl.$^7$ ................................................ G03F 9/00
(52) U.S. Cl. .......................................... 430/5; 430/322
(58) Field of Search ..................................... 430/5, 322

(56) References Cited

U.S. PATENT DOCUMENTS

| | | | |
|---|---|---|---|
| 4,833,051 A | | 5/1989 | Imamura |
| 5,738,959 A | * | 4/1998 | Miyashita et al. ............. 430/5 |
| 5,916,712 A | * | 6/1999 | Miyashita et al. ............. 430/5 |
| 6,350,549 B1 | * | 2/2002 | Sakurai et al. ................ 430/51 |

FOREIGN PATENT DOCUMENTS

| | | |
|---|---|---|
| GB | 2036367 A | 6/1980 |
| JP | 55-121443 | 9/1980 |
| JP | 56-029238 | 3/1981 |
| JP | 06-282066 | 10/1994 |
| JP | 07-261369 | 10/1995 |
| JP | 2001-083690 | 3/2001 |
| WO | WO 01/35125 A1 | 5/2001 |

OTHER PUBLICATIONS

Mason, Kenneth, Reusable Pellicle for 1X Masks, Reserch Disclosure, Kenneth Mason Publications, Hampshire, GB, NR. 259, Page(s) 588 XP000835966, ISSN: 0374–4353.

* cited by examiner

*Primary Examiner*—Geraldine Letscher
(74) *Attorney, Agent, or Firm*—Timothy J. Keefer; Seyfarth Shaw LLP

(57) ABSTRACT

It is an object of the present invention to provide a photomask equipped with a dust-proofing device which has high ultraviolet transmittance in a short wavelength region and high light resistance and is free from the necessity of the substitution with inert gas and also to, provide an exposure method using this photomask. The photomask equipped with a dust-proofing device is produced by overlapping a ultraviolet ray-transmittable transparent substrate on the side of the light-shading film pattern surface of the photomask to apply the photomask to the transparent substrate tightly by exhausting and removing the air present between the photomask and the transparent substrate. A transparent film which transmits ultraviolet rays maybe formed on the surface of the photomask on the side of a light-shading film pattern surface and a ultraviolet ray-transmittable transparent substrate may be overlapped on the transparent film to apply the photomask to the transparent substrate tightly by exhausting and removing the air present between the transparent film and the transparent substrate.

6 Claims, 1 Drawing Sheet

PHOTOMASK WITH DUST-PROOFING DEVICE AND EXPOSURE METHOD USING THE SAME

BACKGROUND OF THE INVENTION

The present invention relates to a dust-proofing device installed for the purpose of preventing the adhesion of foreign substances to a photomask used in a process of producing high density integrated circuits such as LSIs and VLSIs, and, more particularly, to a photomask equipped with a dust-proofing device which photomask is superior in the transmittance of ultraviolet rays in a short wavelength region and in light resistance and an exposure method using the photomask.

A pellicle having a structure in which as shown in FIG. 3, an organic thin film formed of nitrocellulose, a fluororesin or the like and having a thickness of several $\mu$m is applied to one side of a frame made of a metal or the like by using an adhesive or the like has been used as a dust-proofing device installed on photomasks used in the production of high density integrated circuits such as LSIs and VLSIs with the intention of preventing the adhesion of foreign substances such as dusts. The pellicle is bonded and secured to the photomask after the adhesive is applied to one side of the frame. The height of the frame is about 3 to 5 mm in general and the surface of the pellicle film is distant from the pattern surface of the photomask by the height of the frame. Therefore, if fine dusts are stuck to the surface of the pellicle film, the image of these dusts is neither formed on nor transferred to a semiconductor wafer to which a resist is applied during exposure.

However, in recent, there has been a strong demand for lithographic technologies enabling the formation of integrated circuits by using a finer line width with the intention of improving the integration of VLSIs and a progress in the use of exposure light source shaving shorter wavelengths has been made. For example, the trend of the light sources for lithography steppers is toward the use of ArF (193 nm) excimer lasers and $F_2$ lasers (157 nm) from the use of a conventional g-line (436 nm), i-line (365 nm), and KrF excimer laser (248 nm).

When exposure wavelengths are shorter, particularly in the vacuum ultraviolet region less than 180 nm, this brings about the drawback that the light transmittance of organic materials such as nitrocellulose is insufficient. Also, because a ArF excimer laser and $F_2$ laser have high energy, pellicles constituted of organic materials have the drawback that its film is denatured and a loss of the film is caused.

In order to obtain high light transmittance in a shorter wavelength region, there is a method using a glass pellicle formed of a synthetic quartz glass made into a thin film 1 mm in thickness as described in the publication of Japanese Patent Application Laid-Open No. 2001-83690. However, the usual atmosphere including oxygen are present inside of the quartz glass pellicle formed on a photomask, posing the problem that the oxygen absorbs light in the case of shorter wavelength light sources, especially, a 157 nm $F_2$ laser, therefore, such devices that the atmosphere in the pellicle is replaced by inert gas, such as nitrogen, which does not absorb light, must be therefore taken. Also, the conventional methods have the problem that since the frame must be secured to the pellicle and the frame must be secured to the photomask by using an adhesive, repeated exposure causes degassing from the adhesive and the decomposition of the adhesive with the result that foreign substances are thereby stuck to the photomask pattern, which causes defects. The problems concerning the sticking of foreign substances caused by the adhesive is made more significant as the exposure wavelength is shorter.

As methods using no pellicle, there are descriptions concerning a photomask having a structure in which a thin plate glass is applied only to the effective parts of the a photomask by using a photocurable adhesive in the publication of Examined Japanese Patent Application No. S61-54211 and also concerning a structure obtained by applying an adhesive to all or part of a photomask and by applying a transparent substrate to the photomask by the adhesive in the publication of Japanese Patent Application Laid-Open No. S55-121443. However, if an adhesive is present in the exposed region of the photomask, repeated exposure causes degassing from the adhesive and the decomposition of the adhesive, giving rise to the problems such as the defects of a photomask caused by foreign substances and partial coloring and reduced ultraviolet transmittance caused by the denaturation of the adhesive. These problems caused by an adhesive are more significant as the exposure wavelength is shorter, giving rise to the drawback that these methods are not practically usable.

SUMMARY OF THE INVENTION

The present invention has been made to solve the aforementioned problems. It is an object of the present invention to provide a photomask equipped with a dust-proofing device which has high ultraviolet transmittance and high resistance to ultraviolet rays and is free from the necessity of the substitution with inert gas and also to provide an exposure method using this photomask.

In order to solve the above problems, in the invention described in a first aspect, there is provided a photomask equipped with a dust-proofing device, the photomask being produced by overlapping a ultraviolet ray-transmittable transparent substrate on the side of the light-shading film pattern surface of the photomask to apply the photomask to the transparent substrate tightly by exhausting and removing the air present between the light-shading film of the photomask and the transparent substrate.

As the transparent substrate transmitting short wavelength ultraviolet rays, a synthetic quartz substrate, single crystal white sapphire, and the like may be used. As the light-shading film, ordinary photomask light-shading materials such as chromium, chromium oxides, chromate nitrides, and the like may be used. The removal of the air present between the light-shading film pattern of the photomask and the transparent substrate can be accomplished by placing the photomask and the transparent substrate which are bound tightly with each other in a pure and vacuum chamber which can secure a vacuum of about $133 \times 10^{-3}$ Pa ($1 \times 10^{-3}$ Torr) in a clean room and exhausting under vacuum at room temperature for several minutes to tens of minutes. In order to increase the bonding strength between the photomask and the transparent substrate, degassing of the both may be carried out in advance by evacuation according to the need. Technologies for applying the photomask to the thin transparent substrate are exemplified in the publication of Japanese Patent Application Laid-Open No. H6-282066.

The transparent substrate serves to prevent dusts from adhering directly to the photomask pattern, and also, even if fine dusts adhere to the transparent substrate, the image of these dusts is neither formed on nor transferred to a semiconductor wafer to which a resist is applied during exposure by the aid of the thickness of the transparent substrate.

Therefore, the transparent substrate functions as a dust-proofing device. It is only required for the transparent substrate to have a thickness of 2 mm or more which is close to the height of an ordinary pellicle frame because it is only required that the dusts on the transparent substrate are not transferred during exposure. Although it is only required for the transparent substrate to have such a size as to cover the region affecting the transfer of the pattern of the photomask, the transparent substrate preferably has the same size as the photomask from the view point of operation ability.

According to a second aspect of the present invention, there is provided a photomask equipped with a dust-proofing device, the photomask being produced by forming a transparent film which transmits ultraviolet rays on the entire surface of the side of a light-shading film pattern surface of the photomask and then by overlapping a ultraviolet ray-transmittable transparent substrate on the transparent film to apply the photomask to the transparent substrate tightly by exhausting and removing the air present between the transparent film on the photomask and the transparent substrate.

The shape and density of the light-shading film pattern of the photomask are diversified and there are photomasks with a light-shading pattern having a small area. The transparent film in the present invention is formed to ease the influence of the step caused by the light-shading film pattern to thereby eliminate dependency on a pattern when it is applied to the transparent substrate, thereby more improving the bonding strength between the transparent substrate and the photomask. It is required for the transparent film formed on the photomask to have superior characteristics such as high ultraviolet ray transmittance for exposure wavelength and light resistance, and as materials to be used for the transparent film, aluminum oxide, magnesium oxide, magnesium fluoride and the like are shown. For example, when a synthetic quartz glass substrate is used as the photomask substrate, silicon oxide having a composition close to that of the quartz glass substrate is more preferable as the transparent film. A silicon oxide film may be formed by a vacuum deposition method such as sputtering method by Ar gas and by using a $SiO_2$ target or a coating glass (spin-on-glass; SOG) method. As the above SOG, OCD Type-2 manufactured by Tokyo Ohka Kogyo Co., Ltd., Aquglass 211S manufactured by Allied Signal, and the like may be used.

According to a third aspect of the present invention, there is provided a photomask equipped with a dust-proofing device, the photomask being produced by forming a transparent film which transmits ultraviolet rays on the entire surface of the side of a light-shading film pattern surface of the photomask, then by flattening the transparent film, and then by overlapping a ultraviolet ray-transmittable transparent substrate on the transparent film to apply the photomask to the transparent substrate tightly by exhausting and removing the air present between the transparent film flatted on the photomask and the transparent substrate.

Although transparent films formed on a photomask have a certain degree of flatness, fine irregularities exist in many transparent films. If fine irregularities of the transparent film which irregularities are produced due to the steps of the light-shading film pattern are removed by polishing and the air present between the transparent film and the transparent substrate is exhausted and removed, the transparent film is bonded with and applied to the entire surface of the transparent substrate. As to a method of flattening the transparent film, the transparent film is polished using a polishing machine by, for example, CMP (Chemical Mechanical Polishing) based on the technologies described in the publication of Japanese Patent Application Laid-Open No. H7-261369 in a predetermined condition.

According to a fourth aspect of the present invention, there is provided an exposure method comprising using the photomask equipped with a dust-proofing device according to the above first aspect to third aspect, removing only the transparent substrate from the photomask to carry out exposure in an exposure apparatus and resetting the transparent substrate to the photomask when the photomask is taken out of the exposure apparatus after the exposure is finished.

The photomask equipped with a dust-proofing device in the present invention may be used for exposure as it is equipped with the dust-proofing device in the same manner as in the case of using an ordinary pellicle, however, the dust-proofing device can be separated with ease by placing the photomask again under vacuum. To state the influence of dusts adhering to the photomask, these dusts usually adhere most during handling in the atmosphere. In the exposure performed in the ultraviolet region under vacuum, it is needed to improve the transmittance of the photomask for ultraviolet rays as much as possible there by raising the efficiency of utilization of exposure light. One of the objects of the exposure method of the present invention is to raise the efficiency of utilization of exposure light by dismounting the transparent substrate from the photomask equipped with a dust-proofing device in an exposure apparatus to carry out exposure when carrying out exposure to light such as a $F_2$ laser having a wavelength in the ultraviolet region. After the exposure is finished, the transparent substrate is reset and stuck to the photomask when the photomask is taken out of the exposure apparatus and the ambience around the photomask is then returned to the atmosphere.

Another object of the exposure method of the present invention resides in the point that an expensive transparent substrate can be reused repeatedly. There is a limitation to materials which transmit short wavelength ultraviolet rays and the transparent substrate is very expensive. In the present invention, however, such a transparent substrate can be reused many times, if necessary the re-polishing is carried out, and therefore the present invention is also economically advantageous.

The transparent substrate to be used for the exposure method of the present invention is not necessarily transparent to exposure light because it is dismounted during exposure, however, transparency is needed for the light used for inspection made after the transparent substrate is stuck and applied to the photomask.

The photomask equipped with a dust-proofing device according to the present invention has high light transmittance even in the case of using a ArF (193 nm) excimer laser and $F_2$ laser (157 nm) whose light sources having short wavelengths ranging from 150 to 200 nm and is highly durable against ultraviolet rays having the same wavelength region, and further, unlike a conventional pellicle, the photomask of the present invention requires no devices for replacing the atmosphere in the inside thereof by inert gas such as nitrogen. Also, since the dust-proofing device according to the present invention has a structure differing from the structure of a conventional pellicle in which a frame is secured to a photomask by using an adhesive, the dust-proofing device can be separated with ease by again putting the photomask equipped with the dust-proofing device under vacuum. Therefore, when the transparent substrate constituting the dust-proofing device is contaminated with dusts and the like, it is possible to exchange the transparent substrate and to wash both the photomask and the transparent substrate for reuse with ease.

Also, the exposure method of the present invention has such an effect that the effect of utilization of exposure light is raised to thereby shorten exposure time thereby improving productivity and an expensive transparent substrate can be reused many times.

DESCRIPTION OF THE PREFERRED EMBODIMENT

The embodiments of the invention will be explained with reference to the drawings by way of the following examples.

EXAMPLE 1

Figure 1:
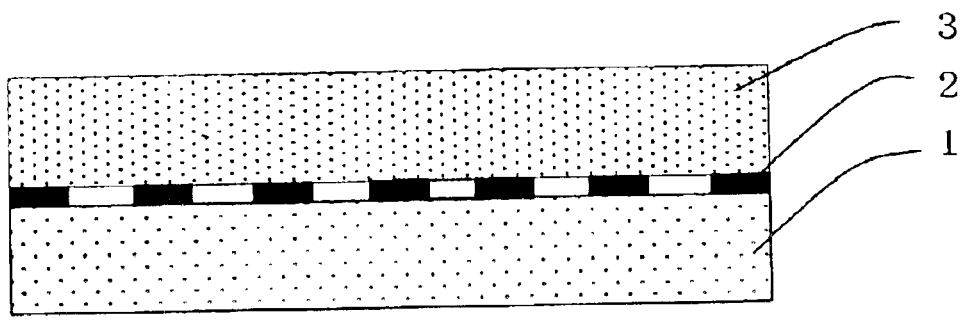
FIG. 1 is an outlined sectional view of a photomask equipped with a dust-proofing device in Example 1.

FIG. 1 is a sectional view showing one example of a photomask equipped with a dust-proofing device according to the present invention. In FIG. 1, a photomask in which a light-shading film pattern 2 having a two-layer structure comprising a chromium thin film having 80 nm in thickness and a low reflective chromium thin film having 40 nm in thickness was formed on an optically polished synthetic quartz glass substrate 1 which was 6 in. by 6 in. square and had a thickness of 0.25 in. was washed and dried, followed by cleaning its surface. Thereafter, a synthetic quartz glass substrate 3 which had the same size as the photomask and a plainness of 2 $\mu$m, was optically polished, washed, and dried, was aligned with the side of the light-shading film pattern surface of the photomask and overlapped on the photomask without using an adhesive or the like. Next, the substrate and the photomask were placed in vacuum equipment in an overlapped state, followed by evacuating under a vacuum of $133 \times 10^{-3}$ Pa ($1 \times 10^{-3}$ Torr) for 10 minutes to bind both the substrates with each other firmly. These two substrates applied in this method were stuck to each other sufficiently and could be used as a photomask equipped with a dust-proofing device in exposure using a ArF excimer laser.

EXAMPLE 2

Figure 2:
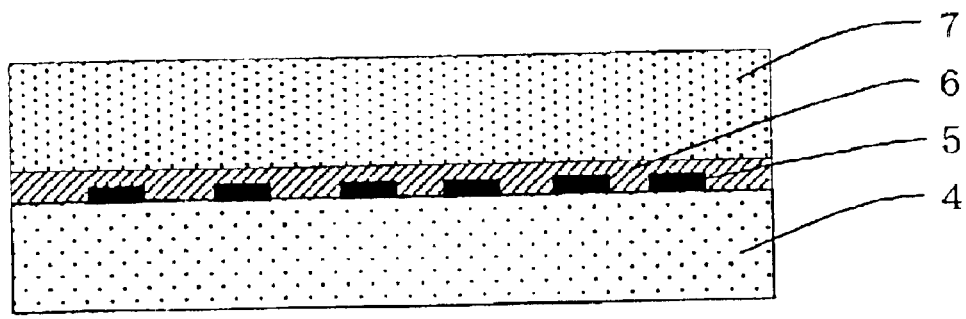
FIG. 2 is an outlined sectional view of a photomask equipped with a dust-proofing device in Example 2.
Figure 3:
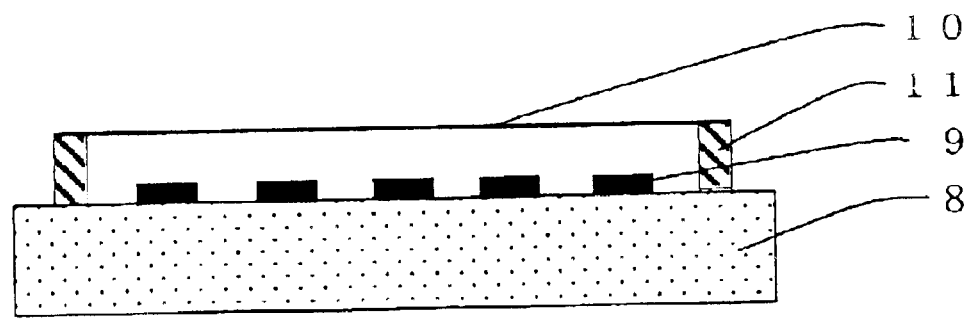
FIG. 3 is an outlined view showing a conventional photomask equipped with a pellicle.

FIG. 2 shows one example of the present invention. A photomask in which a light-shading film pattern 5 having a three-layer structure comprising a center chromium thin film having 60 nm in thickness and low reflective chromium thin films having 40 nm in thickness formed respectively on the upper and lower sides of the above center film was formed on an optically polished synthetic quartz glass substrate which was 6 in. by 6 in. square and had a thickness of 0.25 in. was washed. Aquglass 211S, which was a commercially available coating glass (spin-on-glass; SOG) manufactured by Allied Signal was applied to the entire surface of the light-shading film pattern by a spin coating method and calcined at 300° C. in a nitrogen atmosphere for one hour to obtain a SOG film having a film thickness of about 800 nm as the thickness of the film obtained after calcined. Next, the SOG was polished by a CMP apparatus SPP600S manufactured by Okamoto Machine Tool Works Ltd. to form a flat SOG film 6 having about 600 nm in thickness. The polishing condition was as follows: ILD1300 manufactured by Rodel Nitta Co., was used as the polishing slurry and IC1100 manufactured by Rodel Nitta Co., was used as the polishing cloth, applied load: 50 g/cm², spindle speed: 30 rpm, and table speed: 30 rpm. Next, an optically polished synthetic quartz glass substrate 7 which had the same size as the photomask was overlapped on the photomask on the side of the flatted SOG film surface and then placed in vacuum equipment, followed by evacuating at room temperature for 20 minutes to obtain a photomask equipped with a dust-proofing device which was firmly bound with the glass substrate. This photomask could be used in exposure using a KrF excimer laser.

EXAMPLE 3

The photomask equipped with a dust-proofing device which was manufactured in Example 1 was placed statically in an exposure apparatus using a $F_2$ laser. After the atmosphere in the apparatus was evacuated to achieve the vacuum state, the transparent substrate was dismounted from the photo mask equipped with a dust-proofing device in the exposure apparatus. Next, the photomask pattern was transferred to a resist on a semiconductor wafer by exposure using a $F_2$ laser. When the photomask was taken out of the exposure apparatus after the exposure was finished, the pressure in the apparatus was returned to the atmosphere after the transparent substrate was reset to the photomask and the both substrates were bound tightly, and then the photomask was again taken out of the exposure apparatus as a photomask equipped with a dust-proofing device.

What is claimed is:

1. A photomask equipped with a dust-proofing device, the photomask being produced by overlapping a ultraviolet ray-transmittable transparent substrate on the side of the light-shading film pattern surface of the photomask to apply the photomask to the transparent substrate tightly by exhausting and removing the air present between the light-shading film of the photomask and the transparent substrate.

2. A photomask equipped with a dust-proofing device, the photomask being produced by forming a transparent film which transmits ultraviolet rays on the entire surface of the side of a light-shading film pattern surface of the photomask and then by overlapping a ultraviolet ray-transmittable transparent substrate on the transparent film to apply the photomask to the transparent substrate tightly by exhausting and removing the air present between the transparent film on the photomask and the transparent substrate.

3. A photomask equipped with a dust-proofing device, the photomask being produced by forming a transparent film which transmits ultraviolet rays on the entire surface of the side of a light-shading film pattern surface of the photomask, then by flattening the transparent film, and then by overlapping a ultraviolet ray-transmittable transparent substrate on the transparent film to apply the photomask to the transparent substrate tightly by exhausting and removing the air present between the transparent film flatted on the photomask and the transparent substrate.

4. An exposure method comprising using the photomask equipped with a dust-proofing device according to claim 1, removing the transparent substrate from the photomask to carry out exposure in an exposure apparatus, resetting the transparent substrate to the photomask after the exposure is finished, and taking out the photomask equipped with a dust-proofing device from the exposure apparatus.

5. An exposure method comprising using the photomask equipped with a dust-proofing device according to claim 2, removing the transparent substrate from the photomask to carry out exposure in an exposure apparatus, resetting the transparent substrate to the photomask after the exposure is finished, and taking out the photomask equipped with a dust-proofing device from the exposure apparatus.

6. An exposure method comprising using the photomask equipped with a dust-proofing device according to claim 3, removing the transparent substrate from the photomask to carry out exposure in an exposure apparatus, resetting the transparent substrate to the photomask after the exposure is finished, and taking out the photomask equipped with a dust-proofing device from the exposure apparatus.

* * * * *